United States Patent
Ando et al.

(10) Patent No.: US 9,537,084 B2
(45) Date of Patent: Jan. 3, 2017

(54) PIEZOELECTRIC SHEET, METHOD FOR MANUFACTURING PIEZOELECTRIC SHEET, AND MANUFACTURING APPARATUS

(71) Applicants: Murata Manufacturing Co., Ltd., Nagaokakyo-shi, Kyoto-fu (JP); A School Corporation Kansai University, Osaka, Suita-shi (JP)

(72) Inventors: Masamichi Ando, Nagaokakyo (JP); Yoshihiro Tajitsu, Suita (JP)

(73) Assignees: MURATA MANUFACTURING CO., LTD., Nagaokakyo-Shi, Kyoto-Fu (JP); A SCHOOL CORPORATION KANSAI UNIVERSITY, Suita-Shi, Osaka (JP)

( * ) Notice: Subject to any disclaimer, the term of this patent is extended or adjusted under 35 U.S.C. 154(b) by 99 days.

(21) Appl. No.: 14/698,996

(22) Filed: Apr. 29, 2015

(65) Prior Publication Data
US 2015/0280106 A1 Oct. 1, 2015

Related U.S. Application Data

(60) Division of application No. 13/865,436, filed on Apr. 18, 2013, now Pat. No. 9,048,426, which is a division
(Continued)

(30) Foreign Application Priority Data

Jun. 15, 2009 (JP) ................................. 2009-142068

(51) Int. Cl.
*H01L 41/193* (2006.01)
*H01L 41/257* (2013.01)
(Continued)

(52) U.S. Cl.
CPC ........... *H01L 41/193* (2013.01); *H01L 41/257* (2013.01); *H01L 41/45* (2013.01);
(Continued)

(58) Field of Classification Search
CPC ...... H01L 41/257; H01L 41/253; H01L 41/45; H01L 2924/2027; H01L 2924/20271; B29C 2035/0855
See application file for complete search history.

(56) References Cited

U.S. PATENT DOCUMENTS 4,269,581 A * 5/1981 Ury .......................... B29C 35/08
219/738
5,298,602 A   3/1994 Shikinami et al.
(Continued)

FOREIGN PATENT DOCUMENTS

JP    05-152638    6/1993
JP    9-110968 A   4/1997
(Continued)

OTHER PUBLICATIONS

Written Opinion of the international Searching Authority for PCT/JP2010/060020, date of mailing Sep. 14, 2010
(Continued)

*Primary Examiner* — Jeremiah Smith
(74) *Attorney, Agent, or Firm* — Arent Fox LLP

(57) ABSTRACT

A specific region of a polylactic acid sheet is heated by a microwave. To allow the polylactic acid sheet to exhibit piezoelectricity in the thickness direction of the polylactic acid sheet, a high voltage is applied to the heated polylactic acid sheet in the thickness direction of the polylactic acid sheet, and thereby the screw axes of at least a part of the polylactic acid molecules are relatively aligned with the thickness direction. Then the polylactic acid sheet is rapidly cooled, and thereby the polylactic acid molecules are immo-
(Continued)

bilized. The same step is executed for other regions of the polylactic acid sheet, and thereby piezoelectricity is imparted to a wide area of the polylactic acid sheet in the thickness direction. The resultant piezoelectric sheet is capable of exhibiting a high piezoelectricity in the thickness direction.

14 Claims, 13 Drawing Sheets

Related U.S. Application Data of application No. 13/325,207, filed on Dec. 14, 2011, which is a continuation of application No. PCT/JP2010/060020, filed on Jun. 14, 2010.

(51) Int. Cl.
    H01L 41/45      (2013.01)
    B29C 35/08      (2006.01)
    H01L 41/253     (2013.01)

(52) U.S. Cl.
    CPC .... B29C 2035/0855 (2013.01); H01L 41/253 (2013.01); Y10T 29/42 (2015.01)

(56) References Cited

U.S. PATENT DOCUMENTS

| | | | |
|---|---|---|---|
| 5,348,983 A | 9/1994 | Sterzel | |
| 6,984,352 B1* | 1/2006 | Akopyan | B29C 33/3828 264/219 |
| 8,241,653 B1 | 8/2012 | Hossainy et al. | |
| 2005/0227099 A1 | 10/2005 | Hiruma | |
| 2007/0034918 A1* | 2/2007 | Ohmi | C01G 35/00 257/295 |
| 2008/0309239 A1* | 12/2008 | Kasai | H01J 37/32192 315/39.51 |
| 2009/0236949 A1* | 9/2009 | Fujii | C23C 14/088 310/367 |

FOREIGN PATENT DOCUMENTS

| | | |
|---|---|---|
| JP | 2000-144545 | 5/2000 |
| JP | 2002-293943 | 10/2002 |
| JP | 3770471 B2 | 11/2003 |
| JP | 2005-203590 | 7/2005 |
| JP | 2005-213376 A | 8/2005 |
| JP | 2010-132899 A | 6/2010 |

OTHER PUBLICATIONS

Tajitsu, Polly Nyusan Maku No Hikan/Denki Kinou (Optical Electric Functions of Polylactic Film), Miral Zairyo, Jul. 2003. vol. 3, No. 7, pp. 16-25

Koga et al. "Piezoelectricity of Poly-L-Lactic Acid" Kyushu Sangyo University Kogakubu Kenkyu Hokoku, No. 37, Heisei 12 Nendo Kogakubu Kikanshi Henshu Iinkai, Dec. 12, 2000

Tajitsu, "Polyactic Acid no Konoka o Misuete-Tokui na Bussei Atsudensei". Gekkan Eco Industry, vol. 11, No. 2, CMC Publishing Co., Ltd., Jan. 25, 2006, pp. 7-14.

Tajitsu, "Rasen Kobunshi to shite no polyactic acid Maku Senkosei Atsudensei Hikari Denki Kino" Optical Alliance, vol. 17, No. 4, Japan Laser Corp., Apr. 1, 2009, pp. 18-21.

Atsushi Sugita el al.: "Crystallization Mechanism of Poly(L-lactic acid) under DC External Field", Japanese Journal of Applied Physics, vol. 45, No. 1B, 2006, pp. 505-508.

* cited by examiner

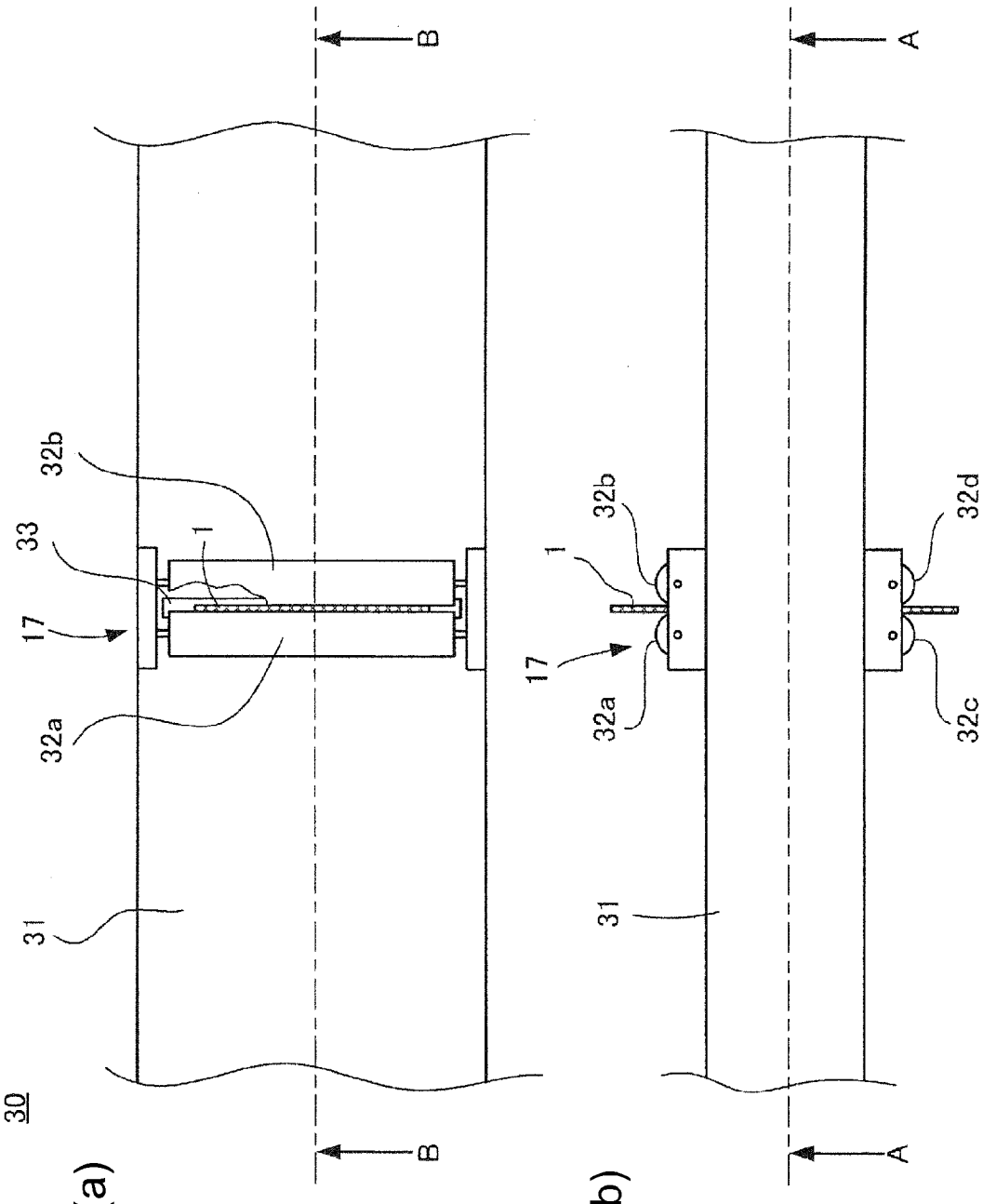

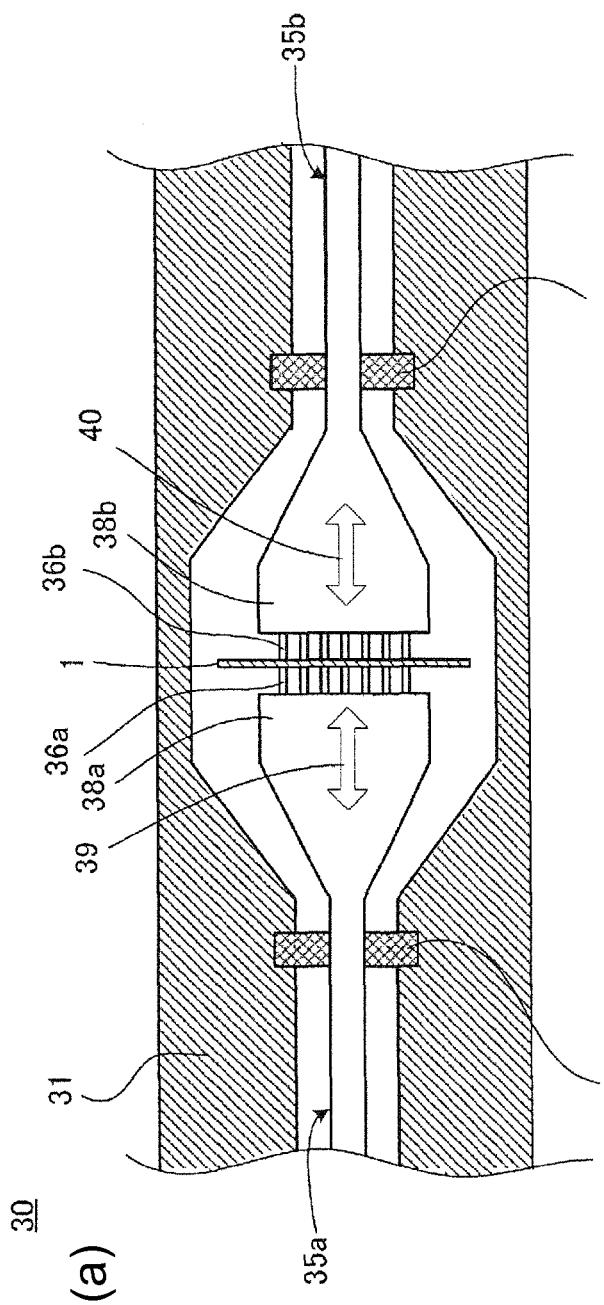
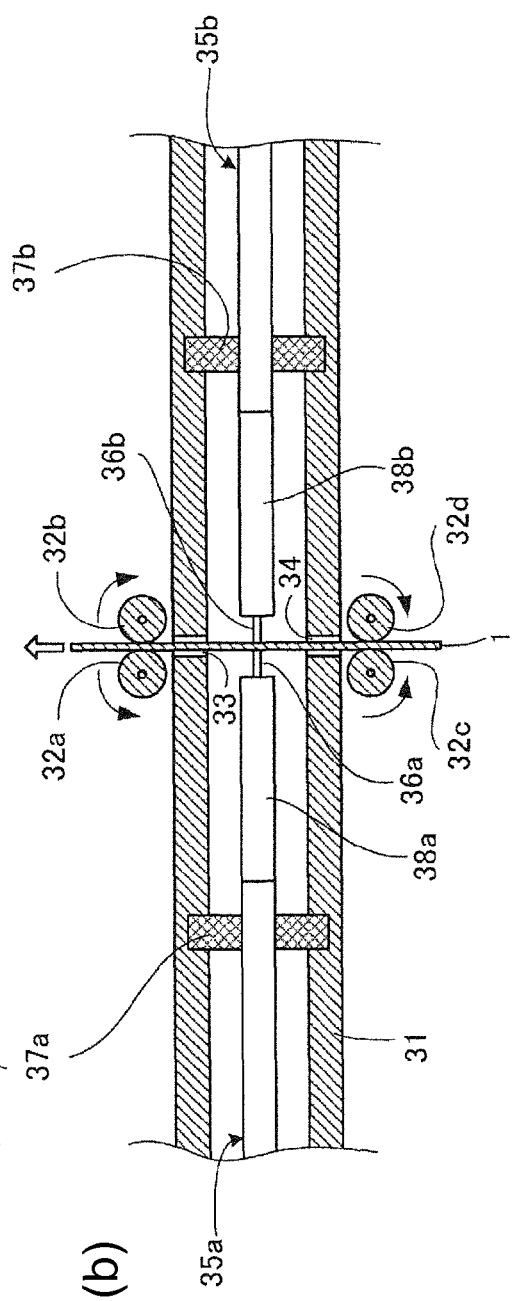
FIG. 4(a)
FIG. 4(b)

FIG. 15(a) $\begin{pmatrix} 0 & 0 & 0 & d_{14} & 0 & 0 \\ 0 & 0 & 0 & 0 & d_{25} & 0 \\ 0 & 0 & 0 & 0 & 0 & d_{36} \end{pmatrix}$ FIG. 15(c) $\begin{pmatrix} 0 & 0 & 0 & d_{14} & 0 & 0 \\ 0 & 0 & 0 & 0 & -d_{14} & 0 \\ 0 & 0 & 0 & 0 & 0 & 0 \end{pmatrix}$

PIEZOELECTRIC SHEET, METHOD FOR MANUFACTURING PIEZOELECTRIC SHEET, AND MANUFACTURING APPARATUS

CROSS REFERENCE TO RELATED APPLICATIONS

The present application is a divisional of application Ser. No. 13/865,436, filed Apr. 18, 2013, which is a divisional of application Ser. No. 13/325,207 (now U.S. Pat. No. 9,048,426) filed Dec. 14, 2011, which is a continuation of International application No. PCT/JP2010/060020, filed Jun. 14, 2010, which claims priority to Japanese Patent Application No. 2009-142068, filed Jun. 15, 2009, the entire contents of each of which are incorporated herein by reference.

FIELD OF THE INVENTION

The present invention relates to a piezoelectric sheet and to method and apparatus for manufacturing the piezoelectric sheet and, more specifically, it relates to a piezoelectric sheet composed of polylactic acid as well as method and apparatus for manufacturing the same.

BACKGROUND OF THE INVENTION

Polylactic acid (PLA) has such a molecular structure as shown in FIG. 14. PLA is dehydrated condensation polymer obtained through ring-opening polymerization of lactide, which is a cyclic dimer of lactic acid. Since lactic acid contains asymmetric carbon, it has chirality. Therefore, L-form and D-form are present in PLA, whose polymers are referred to as poly L-lactic acid (PLLA) and poly D-lactic acid (PDLA), respectively. Main chain of PLLA has left-handed helix structure, and main chain of PDLA has right-handed helix structure. Polylactic acid derived from lactic acid synthesized by microorganism is mostly in L-form and, currently mass-produced and used PLA is PLLA.

As described, for example, in Patent Literature 1 and Non-Patent Literature 1, a stretched PLA film exhibits piezoelectricity. According to Non-Patent Literature 1, point group of PLLA crystal is $D_2$, and has such component as shown in FIG. 15($a$) as piezoelectric tensor.

PLLA is helical polymer having dipoles of large value in the helix axis direction (C-axis direction). Crystal structure of PLLA is packed with dipoles in the C-axis direction facing opposite directions alternately. Therefore, macroscopically, dipoles in the C-axis direction are cancelled with each other to be zero. Therefore, assuming that a PLLA sheet is stretched in "3" axis direction as shown in FIG. 15($b$), the piezoelectric tensor of the stretched, uniaxially-oriented PLLA sheet comes to have such component as shown in FIG. 15($c$) as a result.

As described, for example, in Patent Literatures 1 and 2, piezoelectric phenomenon of conventional piezoelectric PLLA mainly comes from $d_{14}$ shown in FIG. 15($c$), of which value is about 10 to 20 pC/N. The piezoelectric constant of PLLA is distinctively high among polymers.

On the other hand, PZT as a representative example of ceramic piezoelectric body commercially available at present has as high a value as $d_{33}$=300 to 700 pC/N, and it is applied to various actuators, piezoelectric buzzers and piezoelectric speakers. PZT, however, is lead-containing material and, from the viewpoint of environmental protection, lead-free piezoelectric material has been desired in the market. Further, among inorganic piezoelectric materials, ceramics are dominant, of which manufacturing cost is high and which inevitably involves disposal by landfill. From the foregoing, polymer piezoelectric material that can be manufactured at a low cost and is easily disposable has been desired. No material having piezoelectric constant comparable to PZT has said to be found.

PVDF (polyvinylidenefluoride) and PLLA are considered promising as polymers having very high piezoelectric constants. Particularly, as can be seen from FIG. 14, PLLA contains only C, O and H as constituent elements and, therefore, it will not emit any harmful substance when incinerated. Further, PLLA is biodegradable plastic that can be fully decomposed to water and $CO_2$ through two steps of decomposition process of hydrolysis and microbial degradation. At present, raw material is corn starch, and petroleum oil is not at all used as the raw material. Except for $CO_2$ derived from energy used in the manufacturing process, PLLA itself does not increase $CO_2$ in the air after decomposition, since original material of PLLA is $CO_2$ in the air. This is the reason why PLLA is considered carbon-neutral, and it attracts attention as environmentally friendly material.

It is noted, however, that piezoelectric constant of PLLA is, for $d_{14}$, at most 20 pC/N, which is very low as compared with the piezoelectric constant of PZT. In order to use PLLA as a replacement of PZT, it is necessary to apply very high voltage at the time of operation. Therefore, conventionally, replacement to PLLA has been very difficult.

PTL 1: Japanese Patent Laying-Open No. 5-152638
PTL 2: Japanese Patent Laying-Open No. 2005-213376
NPL 1: Yoshiro TAJITSU, "Poly Nyusan Maku no Hikari/Denki Kinou (Optical/Electric Functions of Polylactic Film)", Mirai Zairyo, July 2003, Vol. 3, No. 7, pp. 16-25.

SUMMARY OF THE INVENTION

In view of the foregoing, an object of the present invention is to provide a piezoelectric sheet having high piezoelectric constant particularly in thickness direction, using polylactic acid.

Another object of the present invention is to provide method and apparatus for manufacturing a piezoelectric sheet such as described above.

The first aspect of the present invention is directed to a piezoelectric sheet composed of polylactic acid having helix axes of at least some polylactic acid molecules oriented relatively in thickness direction, to exhibit piezoelectricity in the thickness direction, in order to solve the technical problem described above.

It is noted that the term "sheet" and the term "film" are sometimes used separately to represent different thicknesses. In the present specification, however, the term "sheet" will be used regardless of the thickness.

Further, as described in the Background section, commonly distributed polylactic acid is poly L-lactic acid. It is noted, however, that the polylactic acid described as a solution to the technical problem encompasses, in concept, poly L-lactic acid, poly D-lactic acid and the mixture of these.

The present invention is also directed to a method of manufacturing the piezoelectric sheet described above. The method of manufacturing a piezoelectric sheet in accordance with the present invention includes the steps of: preparing a polylactic acid sheet; heating the polylactic acid sheet using a microwave; and applying a high voltage in thickness direction of the heated polylactic acid sheet, to orient helix axes of at least some of polylactic molecules relatively to the thickness direction, to have piezoelectricity exhibited in the thickness direction of the polylactic acid sheet.

Preferably, the method of manufacturing a piezoelectric sheet according to the present invention further includes the step of quenching the polylactic acid sheet after the step of applying high voltage.

Preferably, in the method of manufacturing a piezoelectric sheet according to the present invention, the step of applying high voltage is executed simultaneously with at least part of the heating step.

The present invention is also directed to an apparatus for manufacturing the piezoelectric sheet described above. The apparatus for manufacturing the piezoelectric sheet in accordance with the present invention includes a high voltage power supply; conductors for applying high voltage, forming a pair arranged to hold therebetween a polylactic acid sheet in thickness direction, for applying a high voltage supplied from the high voltage power supply in the thickness direction of the polylactic acid sheet to be processed; a microwave generator for generating a microwave; and a coaxial line transmitting the microwave from the microwave generator; wherein the conductors for applying high voltage are connected to an inner conductor of the coaxial line, and adapted to generate heat by dielectric loss, when the microwave passes through a capacitor formed by the polylactic acid sheet and the conductors for applying high voltage holding the sheet.

According to another embodiment, the apparatus for manufacturing a piezoelectric sheet in accordance with the present invention includes a high voltage power supply; conductors for applying high voltage, forming a pair arranged to hold therebetween a polylactic acid sheet in thickness direction, for applying a high voltage supplied from the high voltage power supply in the thickness direction of the polylactic acid sheet to be processed; a microwave generator for generating a microwave; a coaxial line transmitting the microwave from the microwave generator; and at least one stage of semi-coaxial cavity filter connected to the coaxial line; wherein one of the conductors for applying high voltage is connected to a central conductor of the semi-coaxial cavity filter, the other one of the conductors for applying high voltage is connected to an outer conductor of the semi-coaxial cavity filter, and the conductors for applying high voltage are adapted to generate heat by dielectric loss, when the microwave passes through a capacitor formed by the polylactic acid sheet and the conductors for applying high voltage.

In the apparatus for manufacturing a piezoelectric sheet in accordance with the present invention, one of the conductors for applying high voltage may be implemented by a plurality of pin-shaped conductors, and the other of the conductors for applying high voltage may be implemented by a planar conductor. Alternatively, one and the other of the conductors for applying high voltage may be implemented by a plurality of pin-shaped conductors, and the plurality of pin-shaped conductors may form pairs with each other without leaving any unpaired conductor.

In the apparatus for manufacturing a piezoelectric sheet in accordance with the present invention, preferably, a plurality of different types of microwaves having frequencies different from each other are generated by the microwave generator. Preferably, the plurality of different types of microwaves include at least a microwave having a frequency mainly effective for heating, a microwave having a frequency mainly suitable for shaking main chain of polylactic acid, and a microwave having a frequency mainly suitable for braking bonding portion bonding polylactic acid molecules with each other.

In the apparatus for manufacturing a piezoelectric sheet in accordance with the present invention, preferably, if the conductor for applying high voltage is implemented by a plurality of pin-shaped conductors, the plurality of pin-shaped conductors are arranged to form a plurality of lines, and each of the pin-shaped conductors of each line is positioned corresponding to a space formed between each of the conductors of an adjacent line. More preferably, the conductor has a square cross section, and the space between adjacent conductors is made equal to length of one side of the square defining the cross section of each conductor.

In the apparatus for manufacturing the piezoelectric sheet in accordance with the present invention, preferably, an outlet of cooling fluid is provided close to the conductor for applying high voltage, for quenching the polylactic acid sheet.

A polylactic acid sheet in a bulk state (formed but unprocessed) has a structure having long helical molecules entangled with each other and, even if a very large electric field is applied in the thickness direction, piezoelectricity is not exhibited in the thickness direction. According to the present invention, in a piezoelectric sheet composed of polylactic acid, the entangled helical molecules are unraveled, and at least in some helical molecules, helix axes are relatively oriented in the thickness direction. Thus, a piezoelectric sheet exhibiting piezoelectricity in the thickness direction can be obtained. If only 10% of helical molecules could be oriented in the thickness direction of the piezoelectric sheet, a piezoelectric body comparable to PZT would be obtained. If higher ratio of molecules could be oriented, a piezoelectric body superior to PZT would result. Even if the ratio is as low as 5%, the resulting piezoelectric body would have remarkably high piezoelectric constant for a polymer piezoelectric body.

PZT widely used for piezoelectric actuators and the like is lead-containing ceramic, which is difficult to dispose of. If piezoelectric constant comparable to PZT can be attained in PLLA, replacement of PZT with PLLA becomes possible. PLLA is biological polymer of simple composition not including heavy metal, which is biodegradable and formed from starch as raw material. Therefore, it does not increase $CO_2$ in the air except for $CO_2$ generated at the time of manufacturing. Further, $CO_2$ generated at the time of manufacturing is quite small in amount as compared with manufacturing of other organic polymers. Therefore, replacement of PZT with PLLA has great effect in reducing environmental load.

Further, since polylactic acid is polymer and has higher flexibility than PZT, it attains higher amount of displacement than PZT when applied to an actuator.

BRIEF DESCRIPTION OF THE DRAWINGS

FIG. 3(a) is a plan view of a PLLA processing unit 30 and FIG. 3(b) is a front view of PLLA processing unit 30, showing details of PLLA processing unit 30 including a PLLA heating unit 17, with PLLA heating unit 17 on the block diagram of FIG. 2 configured as a transmission line type unit.

FIG. 4(*a*) is a cross-sectional view taken along line A-A of FIG. 3(*b*) and FIG. 4(*b*) is a cross-sectional view taken along line B-B of FIG. 3(*a*).

DETAILED DESCRIPTION OF THE INVENTION

Figure 14:
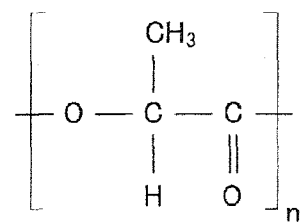
FIG. 14 shows molecular structure of polylactic acid.
Figure 15B:
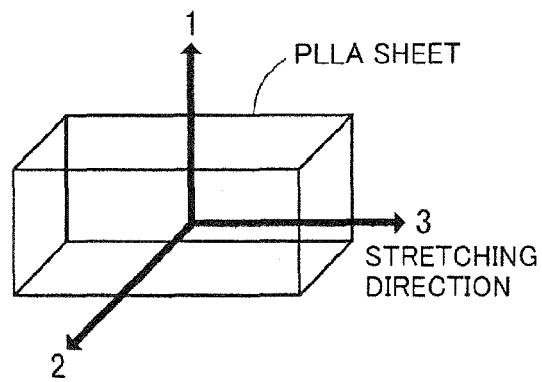
FIG. 15(*a*) shows a piezoelectric tensor of a PLLA crystal, FIG. 15(*b*) shows a direction of stretching a PLLA sheet, and FIG. 15(*c*) shows a piezoelectric tensor of a uniaxially-oriented PLLA sheet.
Figure 16:
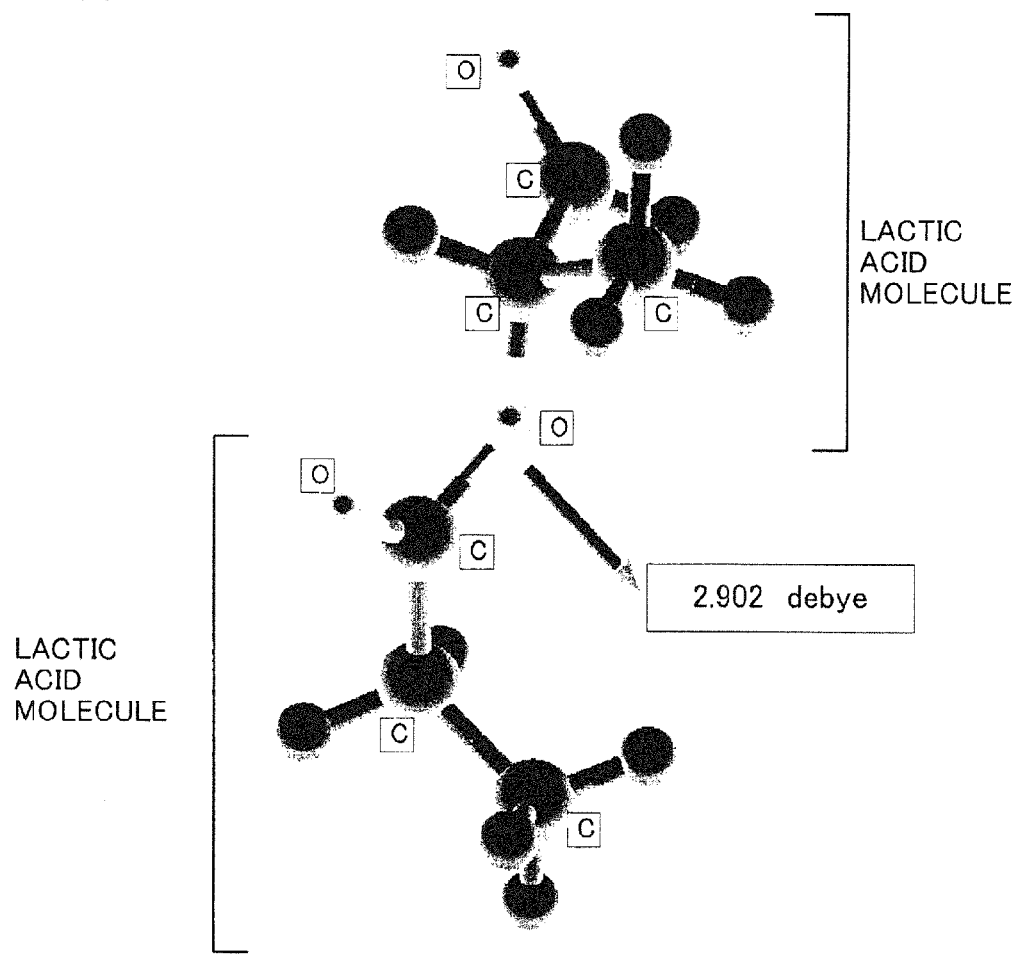
FIG. 16 illustrates two bonded lactic acid molecules.

PLLA has such a molecular structure as shown in FIG. 14, as described above, and on a main chain, there is a molecular group generating permanent dipoles, such as C=O. When we consider two bonded lactic acid molecules, electric dipoles such as shown in FIG. 16 appear.

As described above, polylactic acid includes PLLA as L-form and PDLA as D-form, and a positive mixture of these may be considered. In this section, however, description will be given with reference to PLLA as an example, for simplicity of description.

Figure 17:
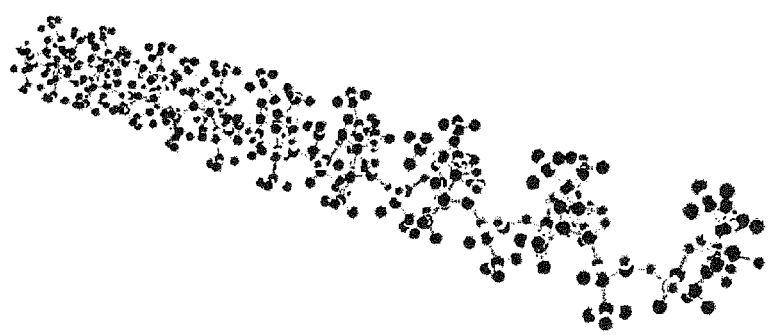
FIG. 17 illustrates lactic acid molecules forming helical molecules through dehydrated condensation.

Dehydrated condensation of lactic acid molecules results in helical molecules, as described above. Molecular model is as shown in FIG. 17. In the molecules of helical structure of PLLA, a sum of vectors of dipoles generated in each molecule is formed, and large dipoles are left in the direction of helix axis. The idea is as shown in FIG. 18.

Figure 18:
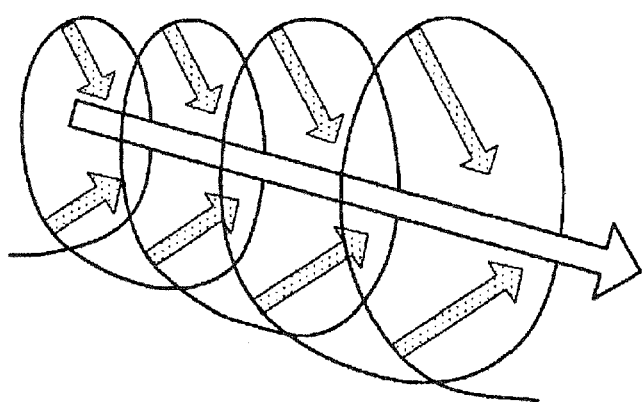
FIG. 18 illustrates a function of helix axis of the lactic acid molecules shown in FIG. 17.

As shown in FIG. 18, PLLA molecules come to have a 10/3 helix structure, in which 10 monomers lead to three turns of helix of molecules. Based on the dipoles in PLLA molecules, if a molecular chain comes to have 10/3 helix structure, the dipole moment in the direction of helix axis is 3.5 to 3.7 debye per one cycle.

Generally, PLLA molecules have molecular weight of several hundreds of thousands, and formed of about 1000 to 3000 cycles. In the following, for simplicity of description, the number of cycles is assumed to be 2000. If this can be oriented as an extended chain, the length will be about 100 nm (in normal lamellar thickness).

Here, the sum of dipoles of the molecules will be $(3.5~3.7) = 2000 = 7000~7400$ debye.

In the following, for simplicity of description, it is assumed to be 7200 debye.

Here, 1 debye=$3.33564 \times 10^{-30}$ C·m and, therefore, 7200 debye=$2.4 \times 10^{-26}$ C·m.

Assuming that two molecular chains are aligned parallel to each other, adjacent molecular chains come close to each other near the radius of PLLA helix, and from the correlation distance of higher order structure of amorphous and crystal structures of PLLA, the distance between helix axes is estimated to be 0.4 to 0.8 nm. In the following, for simplicity of description, the value is assumed to be 0.4 nm.

Here, polarizability Ps is given as $Ps = 2.4 \times 10^{-26} \times 2/(0.4 \times 10^{-9} \times 0.4 \times 10^{-9} \times 100 \times 10^{-9}) = 3.0$ $C/m^2$.

Using polarizability Ps, macroscopic piezoelectric stress constant e of polymer is given by Equation (1) below. In Equation (1), ν represents Poisson constant and e' represents microscopic piezoelectric stress constant.

$$e_{31} = e_{31}' - \nu_{21}e_{32}' - \nu_{31}e_{33}' + (1-\nu_{21})Ps \quad (1)$$

Here, 3 axis is assumed to be in the C axis direction.

The first to third terms of Equation (1) are piezoelectric stress constants derived directly from the molecular structure and very small. The fourth term depends on the polarizability Ps and in case of PLLA described here, Ps is very large. Therefore, Equation (1) can be approximated to Equation (2) below.

$$e_{31} \approx (1-\nu_{21})Ps \quad (2)$$

A polymer typically has $\nu_{21}$ value of about 0.2 to about 0.5. For PLLA, $\nu_{21} \approx 0.3$. Therefore, $$e_{31} = 0.7 \, Ps \quad (3).$$

Since Ps=3.0 $C/m^2$ as mentioned above, $e_{31} = 0.7 \times 3.0 = 2.1 \, C/m^2$.

Here, piezoelectric strain constant (d constant) is given by $$d_{31} = e_{31} \cdot S^E \quad (4)$$

where $S^E$ represents elastic compliance. Unstretched film of PLLA has elastic constant of about 3.7 GPa, and 4-times stretched film has elastic constant of about 1.8 GPa. In a stretched film, C axis is oriented in the direction of stretching.

It is assumed that PLLA in accordance with the present invention has very high orientation and, elastic constant of such polymer is considered to be about 1 GPa. Therefore, the d constant can be estimated as $d_{31} = 2.1/1 \times 10^9 = 2100 \, pC/N$.

When Poisson constant is 0.3, the relation between piezoelectric constants $d_{31}$ and $d_{33}$ is approximately $d_{33}=2d_{31}$. Therefore, $d_{33}=2100\times 2=4200$ pC/N.

As described above, if dipoles along the C axis (helix axis) of PLLA helical molecules could be perfectly oriented in the thickness direction, considering numerical range, the piezoelectric constant of PLLA could possibly be as high as 1000 to 5000 pC/N. Such an implementation, however, has not yet been realized.

By arranging helix axes to be vertical to the thickness direction of the film and thereby braking the alternately packed state of dipoles along the C axis by about 10%, or by exploiting about 10% of intrinsic potential of PLLA, it is believed that the value of $d_{33}$ as high as 100 to 500 pC/N can be attained (here, 3 axis is in the thickness direction of the film), which is substantially comparable to the piezoelectric constant of PZT.

The PLLA sheet such as described above can be manufactured in the following manner.

Figure 1:
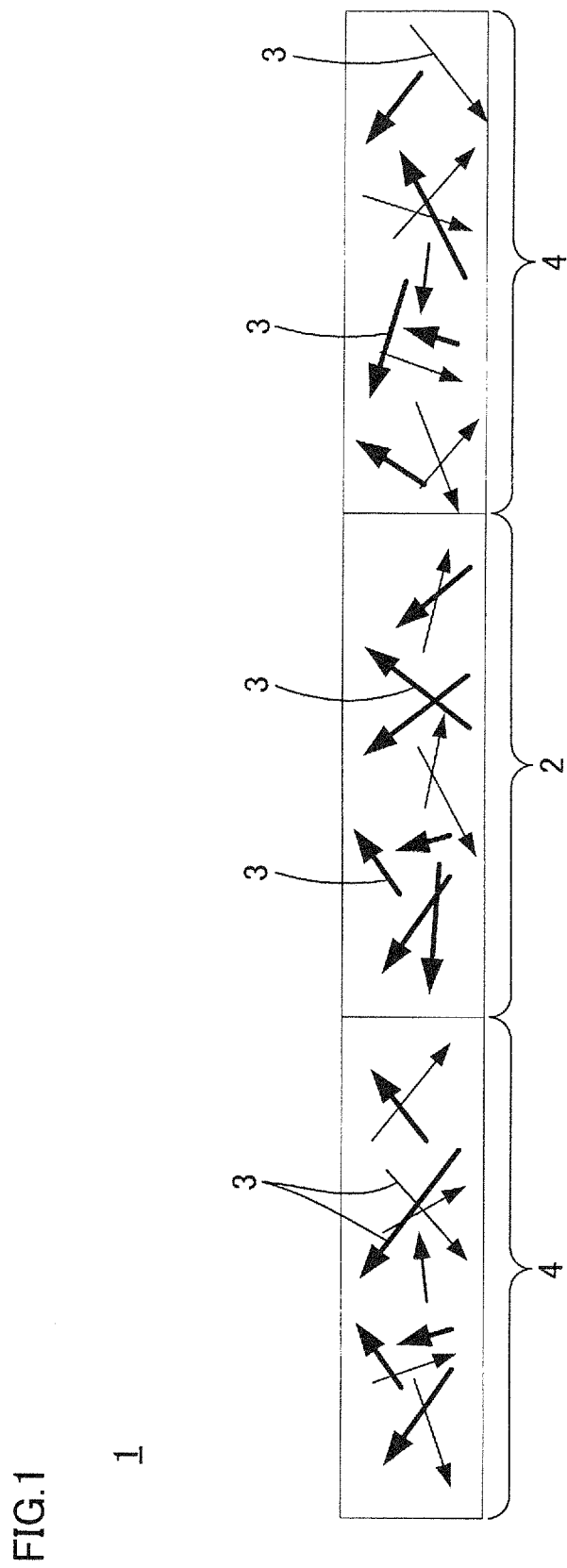
FIG. 1 is a cross-sectional view of a PLLA sheet 1, illustrating a state in which at least some of helix axes 3 of PLLA molecules are relatively oriented in the thickness direction, by the manufacturing method of the present invention.

Referring to FIG. 1, microwave is applied to a very small region 2 of about 0.01 to about 1 mm² of an unprocessed PLLA sheet 1. This causes electric field alternation to act on dipoles, resulting in forced vibration of PLLA molecules. In FIG. 1, arrows represent helix axes 3 of PLLA molecules. The direction of each arrow represents the direction of orientation. As a result of the vibration, heat generates and makes PLLA molecules more mobile, and by microwave vibration, entangled molecular chains are unraveled.

In the state described above, by applying a strong electric field in the thickness direction of PLLA sheet 1 in the prescribed region 2, helix axes 3 of at least some of PLLA molecules come to be oriented relatively in the thickness direction, to exhibit piezoelectricity in the thickness direction. FIG. 1 shows the state of orientation in this region 2.

As can be seen from FIG. 1, in order to have PLLA sheet 1 exhibit piezoelectricity in the thickness direction at region 2, it is unnecessary to have helix axes 3 of all PLLA molecules oriented in the thickness direction, in a direction not causing cancellation of orientation of dipoles with each other. What is necessary is to have helix axes of only some of the PLLA molecules oriented in the thickness direction. Further, it is not always necessary that helix axes 3 oriented in the thickness direction are vertical (90 degrees) to the main surface direction of PLLA sheet 1. The orientation may be at an angle of 5 to 10 degrees to the main surface direction, and what is essential is that the axes are relatively in the thickness direction.

Next, after applying the strong electric field as described above, region 2 of PLLA sheet 1 is quenched and PLLA molecules are immobilized.

The above-described process steps are repeated with the position of PLLA sheet 1 shifted such that a region 4 next to region 2 is subjected to the same process. In this manner, over a wide area of PLLA sheet 1, helix axes 3 come to be oriented relatively in the thickness direction, whereby a piezoelectric sheet having high piezoelectric constant, composed of PLLA sheet 1, is obtained.

As to the microwave to be applied, not a microwave of single frequency but a plurality of different types of microwaves of different frequencies diplexed or mixed (modulated) is preferred, to include at least microwaves having a frequency mainly suitable for heating, a frequency mainly suitable for shaking main chains and a frequency mainly suitable for breaking molecular bonding to each other. Frequencies and intensities of microwaves may appropriately be determined through experiments.

It is noted here that region 2 should desirably be a microscopic region. That the region 2 is made larger means the region to be heated is made larger. When the region to be heated is made larger, polymers contained in the region tend to act on each other, leading to growth of crystal referred to as spherocrystal. Spherocrystal refers to crystal that grows spherically in radially symmetric manner. Spherocrystal itself is nonpolar and, therefore, the above-described orientation cannot be attained. Therefore, orientation operation of microscopic region not promoting generation of spherocrystal is necessary. Though a smaller region is better, from the viewpoint of practical application, assuming that the region is circular, the area thereof is in the range of 0.01 to 1 mm² The size may vary depending on the thickness and molecular weight of PLLA sheet 1 and, if any additive is dispersed in PLLA sheet 1, depending on the type and size of the additive.

As the method of heating microscopic region, heating with a laser spot may be possible. Such an approach, however, has a problem that electrodes for applying strong electric field for realizing orientation of helix axes of PLLA cannot be formed, or the electrodes hinder irradiation of a prescribed position with the laser spot. In contrast, heating of microscopic region with microwaves described in the foregoing is very advantageous in that microwave irradiation and application of DC electric field can be done simultaneously.

Figure 2:
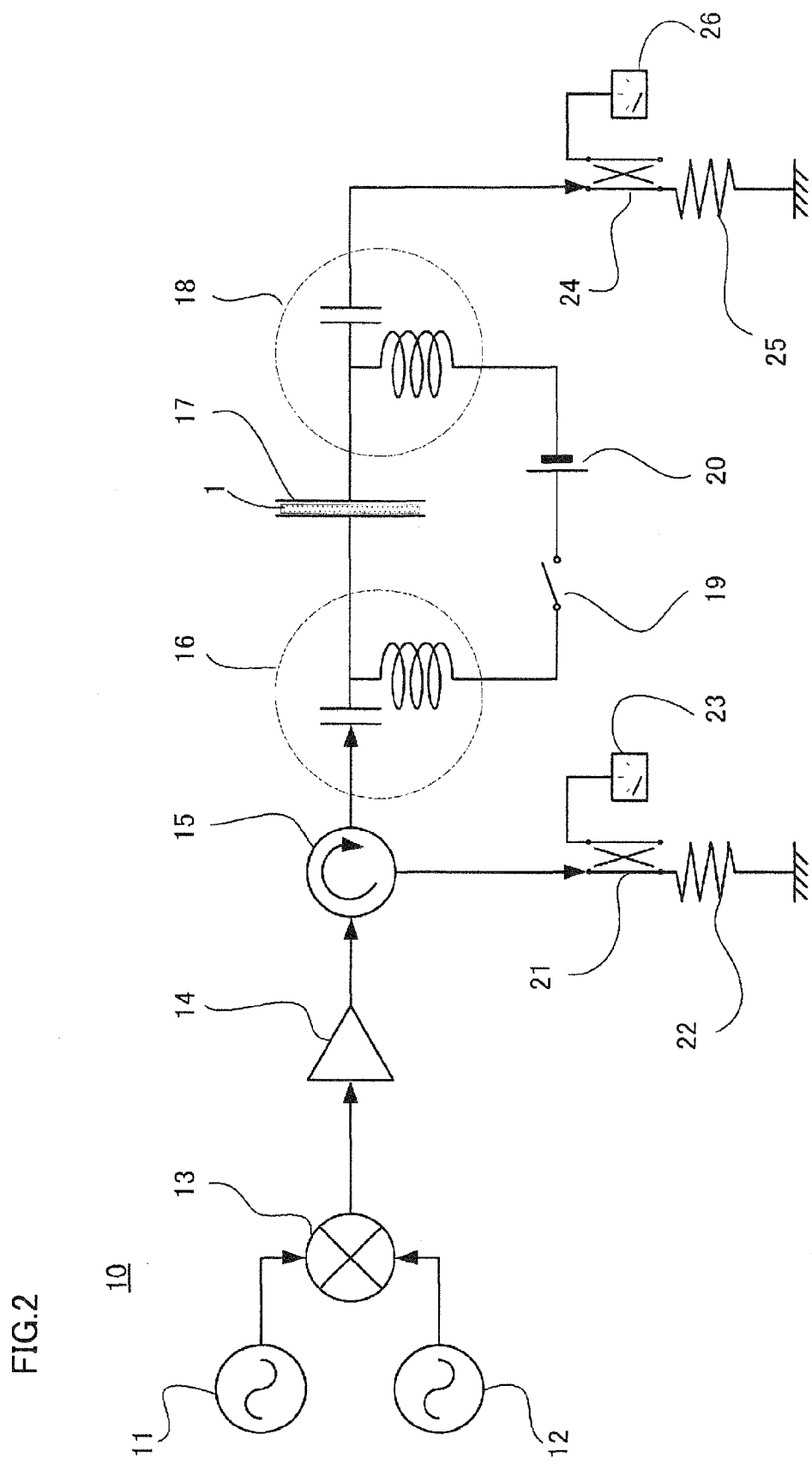
FIG. 2 is a block diagram showing a manufacturing apparatus 10 in accordance with an embodiment of the present invention.

FIG. 2 is a block diagram showing an apparatus 10 for manufacturing the piezoelectric sheet in accordance with an embodiment of the present invention. In manufacturing apparatus 10, prescribed process steps are executed on a prepared PLLA sheet 1 to manufacture the piezoelectric sheet.

Microwaves for vibrating molecules of PLLA constituting PLLA sheet 1 are generated by signal generators 11 and 12. Though two signal generators 11 and 12 are used in the example of FIG. 2, the number of generators may appropriately be changed in accordance with the number of different types of microwaves to be applied. The generated microwaves are adapted to have a frequency mainly for heating PLLA, a frequency mainly for unraveling entangled molecules, and a frequency mainly for breaking molecular bonding with each other (partial crystallization). These frequencies vary depending on the molecular weight of PLLA as the material, blend ratio of D-form, crystallinity, degree of orientation and the amount of filler. Therefore, optimal frequency and level of application may be determined by conducting initial experiments for each base material to be used.

The ratio of input levels of microwaves having different frequencies is determined by output levels of signal generators 11 and 12. A plurality of different types of microwaves having frequencies different from each other emitted from signal generators 11 and 12 are mixed by a mixer 13 and, thereafter, transmitted to an amplifier 14.

Though mixer 13 is used in the example shown in FIG. 2 to mix a plurality of different types of microwaves having frequencies different from each other, a diplexer may be used in place of mixer 13. Further, the number of signal generators may be increased and a triplexer or quadplexer may be used.

The microwaves amplified by amplifier 14 pass through a circulator 15 and a bias tee 16, and reach a PLLA heating unit 17. Circulator 15 is provided to prevent reflected power resulting from mismatch of PLLA heating unit 17 from returning to amplifier 14 to damage amplifier 14. The reflected power resulting from mismatch of PLLA heating unit 17 is branched by circulator 15, passes through a coupler 21 and reaches attenuator 22, where the power is consumed. A power meter 23 is connected to coupler 21 to monitor the reflected power.

PLLA heating unit 17 is configured to prevent passage of DC current therethrough. PLLA heating unit 17 may have a transmission line type configuration or a resonator included configuration. In FIG. 2, PLLA heating unit 17 is simply depicted as a capacitor and, actually, a microwave equivalent circuit is formed. In any case, PLLA heating unit 17 has a portion where a capacitor is formed with PLLA sheet 1 when viewed as a circuit, in a path through which electric power passes, whereby passage of DC current is prevented. Details of PLLA heating unit 17 are shown in FIGS. 3(*a*) and 3(*b*) and following figures. Description with reference to FIGS. 3(*a*) and 3(*b*) and following figures will be given later.

As described above, PLLA heating unit 17 has a portion where a capacitor is formed with PLLA sheet 1 when viewed as a circuit, in a path through which electric power passes. When microwave passes through this portion, part of the wave is converted to heat because of dielectric loss. Dielectric tangent (tan δ) of PLLA is 0.01 to 0.012 (for example, see Japanese Patent Laying-Open No. 2002-358829) and in a capacitor using PLLA as a dielectric, heat inevitably generates in accordance with tan δ. In addition, heat also generates by friction of electric dipoles.

The microwaves that have passed through PLLA heating unit 17 pass through bias tee 18 and thereafter through a coupler 24 and reach an attenuator 25, where they are consumed. A power meter 26 is connected to coupler 24 to monitor electric power passed therethrough.

By measuring passage loss from circulator 15 to attenuator 25 in advance, and by subtracting from output electric power the reflected power monitored by power meter 23, passage electric power monitored by power meter 26 and the passage loss measured in advance, the electric power consumed by PLLA heating unit 17 can indirectly be grasped. The electric power consumed by PLLA heating unit 17 represents energy converted to heat on PLLA sheet 1 and from this value, it is possible to roughly know to what temperature PLLA sheet 1 is heated. To be exact, the temperature of PLLA sheet 1 may be directly measured using, for example, an infrared contact-free thermometer.

Melting point of PLLA is approximately at 170° C., and it has been confirmed through experiments that temperature of approximately 140° C. to 150° C. is suitable for controlling orientation of molecules. The temperature, however, varies depending on the molecular weight of PLLA, additives, and processing of terminal group of molecules and, therefore, it is selected appropriately for actually used PLLA sheet 1.

To bias tees 16 and 18, a high voltage DC power supply 20 and a switch 19 are connected. When PLLA sheet 1 is heated to a temperature suitable for orientation, switch 19 is turned on, to apply high voltage to PLLA sheet 1. At least some of the dipoles shaken by the microwaves are oriented, by the electric field generated by the high voltage, relatively in the thickness direction (the direction of the electric field). The magnitude and time of application of the voltage also depend on the molecular weight, additives, and processing of terminal group of molecules and, therefore, it is selected appropriately for actually used PLLA sheet 1.

The microwaves and the high voltage are applied for a prescribed time period and, simultaneously with stopping the application, PLLA sheet 1 is subjected to forced quenching, so that the molecules are immobilized. It is not always necessary, however, that the timing of cooling be immediately after the stop of application of microwaves and high voltage. Application of microwaves and high voltage may be stopped after the start of cooling, or application of microwaves may be stopped first, followed by the start of cooling and then application of high voltage may be stopped.

Next, PLLA heating unit 17 will be described.

FIGS. 3(*a*) and 3(*b*) shows details of a PLLA processing unit 30 including PLLA heating unit 17, with PLLA heating unit 17 on the block diagram of FIG. 2 configured as a transmission line type unit. Here, FIG. 3(*a*) is a plan view of PLLA processing unit 3, and FIG. 3(*b*) is a front view of PLLA processing unit 3. Further, FIG. 4(*a*) is a cross-sectional view taken along line A-A of FIG. 3(*b*), and FIG. 4(*b*) is a cross-sectional view taken along line B-B of FIG. 3(*a*).

PLLA processing unit 30 has a housing 31, and holes 33 and 34 for inserting PLLA sheet 1 are formed in housing 31. As is well shown in FIG. 4(*b*), holes 33 and 34 are formed to pass through upper and lower walls of housing 31. PLLA sheet 1 is inserted through holes 33 and 34 and processed in this state.

On housing 31, a pair of guide rollers 32*a* and 32*b* and a pair of guide rollers 32*c* and 32*d* are provided, and PLLA sheet 1 is held by these guide rollers 32*a* to 32*d*. By rotating guide rollers 32*a* to 32*d*, PLLA sheet 1 can be moved in up/down directions of FIGS. 3(*b*) and 4(*b*). Arrows around guide rollers 32*a* to 32*d* and an arrow above PLLA sheet 1 shown in FIG. 4(*b*) represent an example of the direction of rotation of guide rollers 32*a* to 32*d* and direction of movement of PLLA sheet 1. Driving unit for driving guide rollers 32*a* to 32*d* is not shown.

Housing 31 is formed of metal and configured as an outer conductor of coaxial line, while forming a cavity inside. Preferable metal used for forming housing 31 may include copper, aluminum, brass, iron and stainless steel and, such metal may be plated as needed. When iron or stainless steel is used, since it has low electric conductivity, copper plating or silver plating is preferred in consideration of transmission loss.

In the cavity of housing 31, inner conductors 35*a* and 35*b* as inner conductors (central conductors) of coaxial line are arranged, held by insulators 37*a* and 37*b*. In FIG. 4(*b*), cross-sections of inner conductors 35*a* and 35*b* are not shown. Insulators 37*a* and 37*b* are formed of resin having low dielectric constant and, particularly, polytetrafluoroethylene is a preferred material.

Inner conductors 35*a* and 35*b* have tip ends 38*a* and 38*b* opposed to each other, respectively, and tip ends 38*a* and 38*b* are made wider than other portions as can be well seen from FIG. 4(*a*). On tip ends 38*a* and 38*b* having the widened shape, a plurality of pin conductors 36*a* and 36*b* as conductors for applying high voltage are provided to form pairs with each other without leaving any unpaired conductor.

The coaxial line implemented by housing 31 and inner conductors 35*a* and 35*b* is formed to have characteristic impedance of 50Ω except for the portion where the cavity is made larger at the central portion in the axial direction, to facilitate matching with a high frequency device. Further, the cavity in housing 31 is enlarged in tapered manner at the central portion along the axial direction, and inner conductors 35*a* and 35*b* also have tip ends 38*a* and 38*b* widened in a tapered manner corresponding to the taper of the cavity. Because of this structure, smooth impedance conversion is possible, and power reflection caused by impedance mismatch is minimized.

As described above, PLLA processing unit 30 is formed as a transmission line type unit and, therefore, it can be applied to a very wide range of frequencies, and design and manufacturing are relatively easy.

Each of pin conductors 36a and each of pin conductors 36b are positioned to be opposite to and aligned on the same axial line with each other. PLLA sheet 1 is pinched by pin conductors 36a and 36b opposite to each other. Between each pair of opposite pin conductors 36a and 36b, a small capacitor is formed. The diameter of each of pin conductors 36a and 36b is about 0.1 mm to about 1 mm, and the space between adjacent ones of pin conductors 36a and 36b is set to be at least the radius of each of pin conductors 36a and 36b. The number of pin conductors 36a and 36b may be appropriately selected. The diameter of each of pin conductors 36a and 36b should preferably be small, since it must be small enough to prevent formation of spherocrystal in PLLA sheet 1.

Though an example has been shown in which pin conductors 36a and 36b pinching PLLA sheet 1 form pairs on opposite sides of PLLA sheet 1, the conductors may be formed as pin conductors on one side and as a planar conductor on the other side. Such a configuration will be described as an example with reference to a PLLA processing unit 50.

Pin conductors 36a and 36b forming pairs as shown in FIGS. 4(a) and 4(b) are suitable for heating smaller regions of PLLA sheet 1, while a configuration having pin conductors on one side and a planar conductor on the other side is advantageous in that assembly of the apparatus is very simple.

Inner conductors 35a and 35b and pin conductors 36a and 36b are formed of metal, as is housing 31. Suitable metal used here may include copper, aluminum, brass, iron, stainless steel, invar and 42 alloy and, such metal may be plated as needed. When iron, stainless steel, invar or 42 alloy is used, since it has low electric conductivity, copper plating or silver plating is preferred in consideration of transmission loss.

While PLLA sheet 1 is heated by transmission of microwaves, the heat of PLLA sheet 1 escapes if inner conductors 35a and 35b and pin conductors 36a and 36b have high thermal conductivity. Therefore, inner conductors 35a and 35b and pin conductors 36a and 36b should preferably be formed using a material having relatively low thermal conductivity such as iron, stainless steel, invar or 42 alloy. Particularly, pin conductors 36a and 36b should preferably be formed of invar or 42 alloy, additionally considering thermal expansion.

Preferable arrangement of pin conductors 36a and 36b will be described later with reference to FIGS. 10 to 13.

As described above, while PLLA sheet 1 is pinched between pin conductors 36a and 36b, microwaves are input to locally heat PLLA sheet 1, to have helix axes of at least some of the PLLA molecules oriented relatively in the thickness direction, and thereafter, the sheet is quenched to have PLLA molecules immobilized.

At the time of quenching, by way of example, a cooling gas is introduced to the inner cavity of housing 31. Though a passage for introducing cooling gas is not shown in FIGS. 3 and 4, it is preferred to provide a passage through which cooling gas flows inside inner conductors 35a and 35b and, at the time of quenching, to have the cooling gas emitted from outlets provided near pin conductors 36a and 36b directly to PLLA sheet 1. Specific examples of the configuration for cooling will be described with reference to FIGS. 5(a) and 5(b) later.

Inner conductors 35a and 35b are movable in directions indicated by arrows 39 and 40 in FIG. 4(a), respectively. After the end of processing, inner conductors 35a and 35b are moved to release pinching of PLLA sheet 1, and then, guide rollers 32a to 32d are rotated to move PLLA sheet 1 by a prescribed distance. After moving PLLA sheet 1, inner conductors 35a and 35b are again moved, to pinch PLLA sheet 1 between pin conductors 36a and 36b, and the above-described process steps of microwave heating, high voltage application and quenching are executed. By repeating such operations, a PLLA sheet 1 having high piezoelectric constant, in which helix axes are oriented relatively in the thickness direction over a wide range, can be obtained.

Figure 5A:
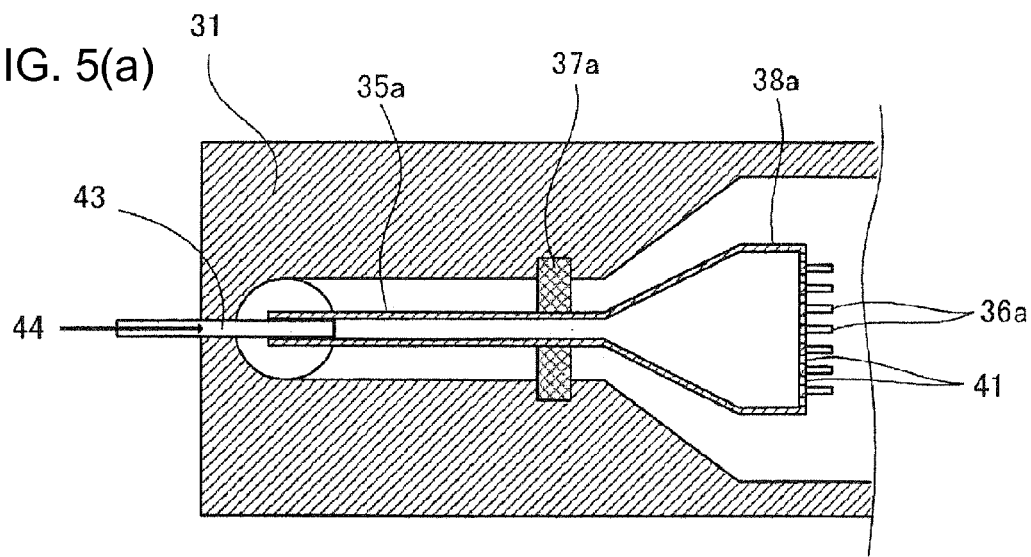
FIG. 5(*a*) is a cross-section of one inner conductor 35*a* shown in FIG. 4(*a*), and FIG. 5(*b*) is a cross-section of one end of transmission line portion including a housing 31 and inner conductors 35*a* and 35*b* not shown in FIG. 4(*b*).

Next, referring to FIGS. 5(a) and 5(b), a configuration suitable for cooling PLLA sheet 1 will be described. FIG. 5(a) shows a cross-section of one inner conductor 35a shown in FIG. 4(a), and FIG. 5(b) shows one end of transmission line portion including housing 31 and inner conductors 35a and 35b, which are not shown in FIG. 4(b).

Figure 5B:
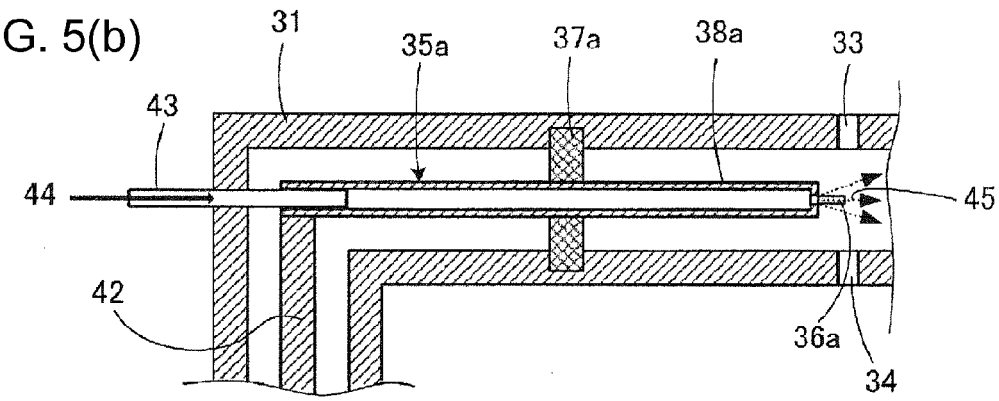

Referring to FIGS. 5(a) and 5(b), inner conductor 35a is formed to have an inner cavity, and on an end surface of tip end 38a where pin conductors 36a are provided, a plurality of outlets 41 are formed near each position of pin conductor 36a. Current caused by microwaves flow through a surface layer of inner conductor 35a because of skin effect and, therefore, the inner cavity of inner conductor 35a does not have any influence on the transmission current of microwaves. Inner conductor 35a is connected to another inner conductor 42 to transmit without reflection the electric power transmitted from inner conductor 42. A coaxial line, on which inner conductor 42 is positioned, is also adapted to have characteristic impedance of 50Ω.

To the other end of inner conductor 35a, a tube 43 formed, for example, of polytetrafluoroethylene is inserted. Cooling gas is introduced to tube 43 from the direction of an arrow 44, and blown out in the direction of an arrow 45 through outlet 41, so as to cool pin conductors 36a and PLLA sheet 1 (not shown in FIGS. 5(a) and 5(b)). HCFC (-134a) or LPG may be suitably used as the cooling gas. In place of the cooling gas, a liquid may be used. Liquid nitrogen may suitably be used as the liquid. In that case, preferably, liquid nitrogen is sprayed from outlets 41.

The configuration for cooling such as described above may be provided only on the side of inner conductor 35a or only on the other inner conductor 35b, or may be provided both on inner conductors 35a and 35b.

By the configuration for cooling described above, PLLA sheet 1 can be cooled with high efficiency, and cooling gas or liquid can be used without waste.

Next, PLLA heating unit 17 of a type different from the transmission line type will be described.PLLA heating unit 17, with PLLA heating unit on the block diagram of FIG.

Figure 6A:
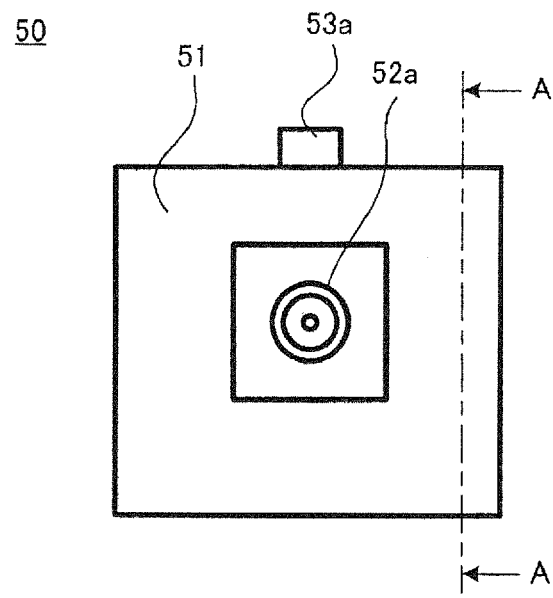
FIG. 6(*a*) is a front view of a PLLA processing unit 50 and FIG. 6(*b*) is a cross-sectional view of PLLA processing unit 50, showing details of PLLA processing unit 50 including PLLA heating unit 17, with PLLA heating unit on the block diagram of FIG. 2 configured as a resonator included unit.
Figure 6B:
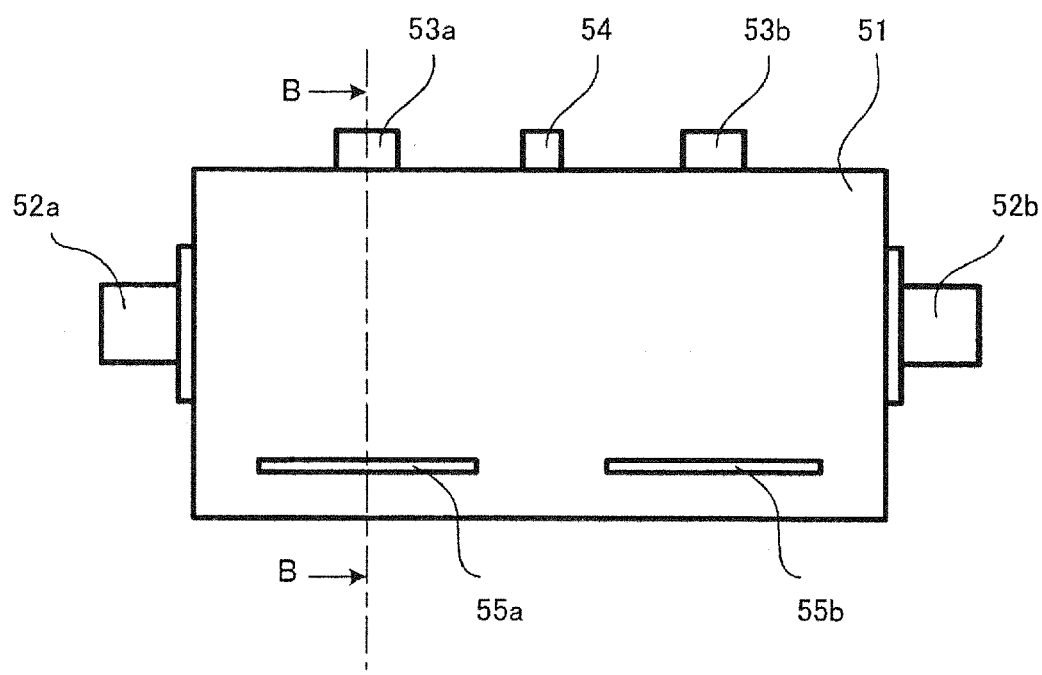
Figure 7A:
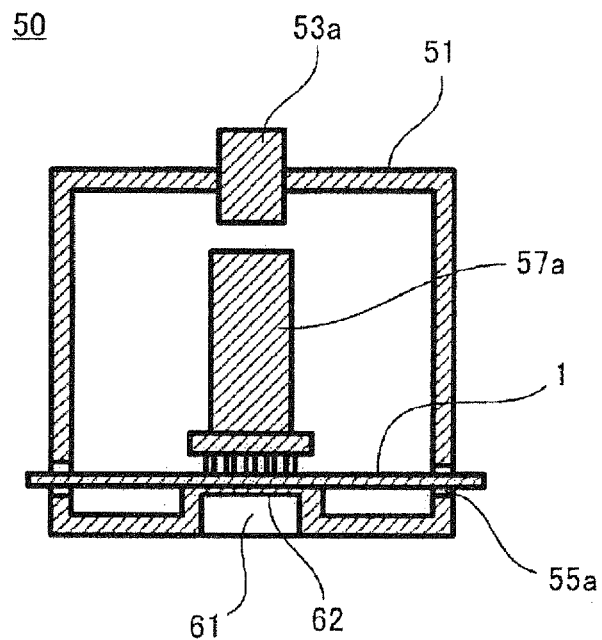
FIG. 7(*a*) is a cross-sectional view taken along line B-B of FIG. 6(*b*) and FIG. 7(*b*) is a cross-sectional view taken along line A-A of FIG. 6(*a*).
Figure 7B:
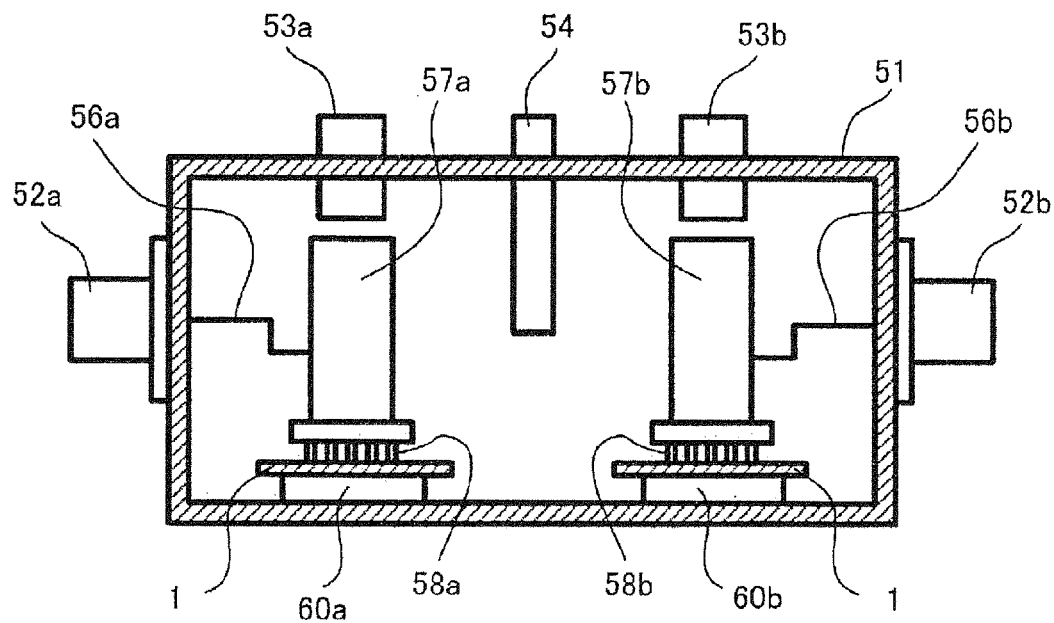

FIGS. 6(a) and 6(b) show details of PLLA processing unit 50 including 2 configured as a resonator included unit. Here, FIG. 6(a) is a front view of PLLA processing unit 50 and FIG. 6(b) is a cross-sectional view of PLLA processing unit 50. FIG. 7(a) is a cross-sectional view taken along line B-B of FIG. 6(b) and FIG. 7(b) is a cross-sectional view taken along line A-A of FIG. 6(a).

PLLA processing unit 50 has a housing 51, and holes 55a and 55b for inserting PLLA sheet 1 are formed in housing 51. As shown in FIG. 7(a), in a wall opposite to the wall having hole 55a formed therein, a hole similar to hole 55a is formed. Though not shown, in a wall opposite to the wall having hole 55b formed therein, a hole similar to hole 55b is formed. As can be well seen from FIG. 7(a), PLLA sheets 1 are arranged to be inserted through hole 55a and the opposite hole and through hole 55b and the opposite hole. In FIGS. 7(a) and 7(b), guide rollers corresponding to guide rollers 32a to 32d provided in PLLA processing unit 30 shown in FIGS. 3(a), 3(b), 4(a) and 4(b) described above are not shown.

Housing 51 is formed of a metal having high electric conductivity. Preferable metal used may include copper, aluminum, brass, iron and stainless steel and, such metal may be plated as needed. When iron or stainless steel is used, since it has low electric conductivity, copper plating or silver plating is preferred in consideration of transmission loss.

Housing 51 has a function of shielding electromagnetic waves, and its inner cavity serves as a resonant cavity. Basically, PLLA processing unit 50 constitutes a semi-coaxial cavity filter. Housing 51 functions as an outer conductor of the semi-coaxial cavity filter. The example shown in FIGS. 6(a), 6(b), 7(a) and 7(b) forms a two-stage band-pass filter.

On the outside of housing 51, connectors 52a and 52b are provided as input/output units for supplying electric power to the filter. Since such a band-pass filter basically has a symmetrical shape, either of conneceters 52a and 52b may be used as an input or output. For convenience, here, description will be given assuming that connector 52a is the input side and connector 52b is the output side.

To a central conductor of connector 52a, one end of an input lead 56a formed of a metal line is connected. The other end of input lead 56a is connected to a central conductor 57a. On one end of central conductor 57a, a plurality of pin conductors 58a are provided. A base electrode 60a providing a planar conductor is arranged to oppose to the tip ends of pin conductors 58a. Between tip ends of pin conductors 58a and base electrode 60a, there is a small space, in which PLLA sheet 1 is held. At this portion, an equivalent circuit of a capacitor is formed. The other end of central conductor 57a is spaced by a prescribed distance from and opposes to tip end of a frequency adjustment screw 53a.

Though not described in detail, as can be seen from FIG. 7(b), an output lead 56b, a central conductor 57b, pin conductors 58b, a base electrode 60b and frequency adjustment screw 53b provided in relation to connector 52b are configured and arranged in the similar manner as output lead 56a, central conductor 57a, pin conductors 58a, base electrode 60a and frequency adjustment screw 53a provided in relation to conneceter 52a described above.

A joint adjustment screw 54 is inserted near the mid-point of central conductors 57a and 57b.

In the configuration shown in FIG. 7(b), PLLA sheet 1 is pinched between pin conductors 58a and base electrode 60a, or between pin conductors 58b and base electrode 60b. As in the case of PLLA processing unit 30 shown in FIGS. 3(a), 3(b), 4(a) and 4(b), pin conductors may be arranged in place of base electrodes 60a and 60b, to be paired with each of pin conductors 58a and 58b.

In PLLA processing unit 50, by adjusting frequency adjustment screws 53a and 53b, input lead 56a and output lead 56b, the filter can be adjusted to desired characteristics, within the range of original electric design.

Central conductors 57a and 57b, frequency adjustment screws 53a and 53b, joint adjustment screws 54, base electrodes 56a and 56b, and pin conductors 58a and 58b are formed of metal. As in the case of housing 51, preferable metal used here may include copper, aluminum, brass, iron and stainless steel and, such metal may be plated as needed. When iron or stainless steel is used, since it has low electric conductivity, copper plating or silver plating is preferred in consideration of transmission loss.

Though not shown, central conductors 57a and 57b are fixed on housing 51 by insulating material having low dielectric constant. Polytetrafluoroethylene is a preferred material of low dielectric conductivity.

The configuration of pin conductors 58a and 58b are similar to that in PLLA processing unit 30 and, therefore, description thereof will not be repeated.

On base electrodes 60a and 60b, a recessed portion (spot face) 61 opened outward is formed as shown in FIG. 7(a), and a bottom wall 62 of recessed portion 61 is formed very thin. Specifically, thickness of bottom wall 62 is preferably about 0.3 to about 0.8 mm. Base electrodes 60a and 60b are preferably formed of metal having high thermal conductivity and, by way of example, aluminum or copper is preferably used.

PLLA sheet 1 pinched between pin conductors 58a and 58b and base electrodes 60a and 60b is heated by the input of microwaves. As described above, to the heated PLLA sheet 1, high voltage is applied and, thereafter, the sheet must be quenched. By directly blowing cooling gas to bottom wall 62 of recessed portion 61, bottom wall 62 can be cooled instantaneously. Here, as bottom wall 62 is formed of metal having high thermal conductivity and is sufficiently thin, PLLA sheet 1 is also cooled substantially simultaneously. The cooling gas is the same as that described above.

Since PLLA processing unit 50 has a resonator included configuration, electric field strength applied to PLLA sheet 1 is significantly higher than in the transmission line type unit and, in a filter designed to have central frequency of 2.4 GHz, the electric field strength is 100 times higher than in the transmission line type unit.

Figure 8:
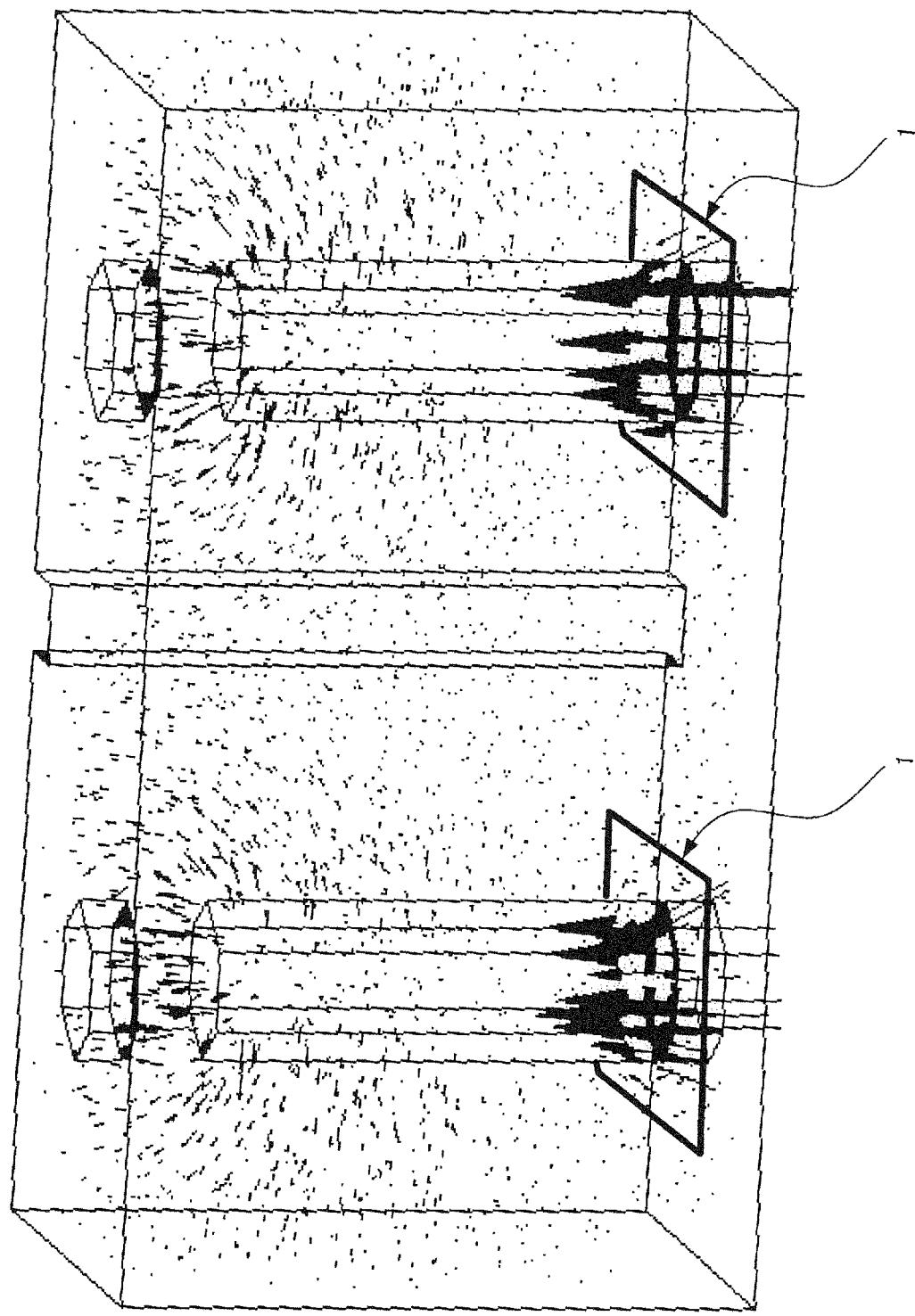
FIG. 8 shows a state of electric field obtained through finite element method simulation, using a simplified model of PLLA processing unit 50 shown in FIGS. 6 and 7.

FIG. 8 shows a result of finite element method simulation, using a simplified model of PLLA processing unit 50. In FIG. 8, arrows represent electric field vectors, whose size indicates electric field intensity. It can be seen that very large electric field vector exists at the position where PLLA sheet 1 is inserted. Therefore, by PLLA processing unit 50, at the time of heating with microwaves, amplifier output can be made lower than in the transmission line type unit.

As described above, PLLA processing unit 50 shown in FIGS. 6(a), 6(b), 7(a) and 7(b) form a two-stage band-pass filter. It may be used as a single-stage band-pass filter using only one semiaxial resonator. In that case, the band-pass filter passes only the frequencies near the pole including the resonant frequency and, therefore, it is for very narrow band and the frequency to be input is limited. On the other hand, it is possible to increase the number of stages of the filter. It may be implemented as a filter of two-stage to about 10 stages as needed. Though the number of stages is not limited, experimentally, up to 10 stages is preferred, considering the time and effort necessary for fabrication. A filter having fractional bandwidth of about 4% may be fabricated relatively easily, with about 4 to about 8 stages. Assuming that the central frequency of passband at this time is 2 GHz, the filter will be a band-pass filter having bandwidth of 70 MHz and, hence, an apparatus capable of simultaneously applying a plurality of frequencies can be obtained.

Figure 9:
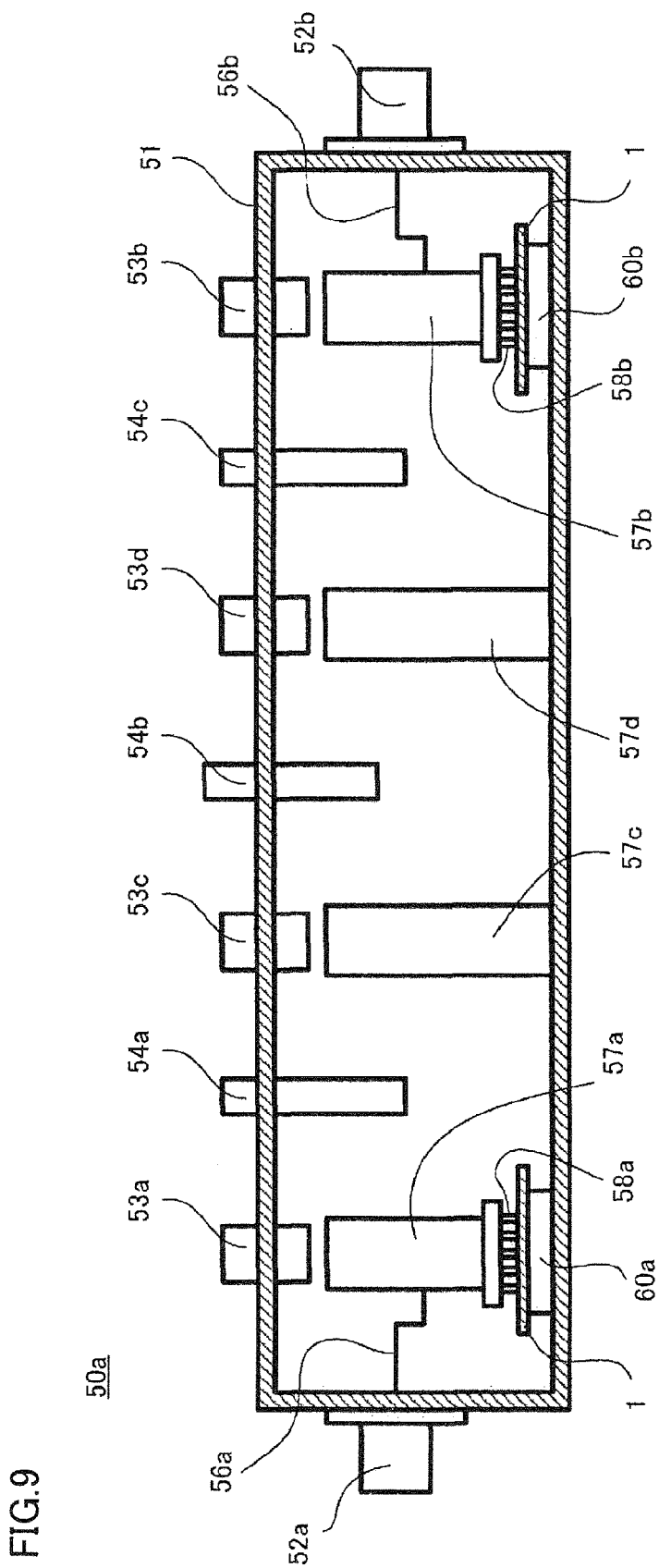
FIG. 9 corresponds to FIG. 7(*b*), showing PLLA processing unit 50*a* formed as a four-stage band-pass.

FIG. 9 shows an example in which the PLLA processing unit is formed as a four-stage band-pass. FIG. 9 corresponds to FIG. 7(b). In FIG. 9, components corresponding to those shown in FIG. 7(b) are denoted by the same reference characters and description thereof will not be repeated. PLLA processing unit 50a shown in FIG. 9 includes central conductors 57c and 57d in addition to central conductors 57a and 57b, and includes frequency adjustment screws 53c and 53d in addition to frequency adjustment screws 53a and 53b. Further, the unit includes three joint adjustment screws 54a, 54b and 54c.

In PLLA processing unit 50a shown in FIG. 9, the microwave heating unit for PLLA sheet 1 can surely be provided on the input stage or output stage or on both input and output stages. In a multi-stage band-pass filter, relatively large energy is accumulated at the input/output stage and, therefore, electric field strength is high at these portions. Further, since high voltage is applied through bias tees 16 and 18 (see FIG. 2), the high voltage can easily be applied at the input/output stage directly connected by the conductors from the central conductor of transmission line (connector).

Though a comb-line type four stage semi-coaxial cavity filter has been described as an example here, it is generally known that a filter of very wide band can be realized by utilizing an interdigital configuration.

Next, examples of preferable arrangement of pin conductors 36a and 36b shown in FIGS. 4(a) and 4(b) will be described with reference to FIGS. 10 to 13. FIGS. 10 to 13 show pin conductors 36a with an end surface at a tip end 38a of inner conductor 35a viewed from the side of PLLA sheet 1. In these figures, outlets 41 shown in FIGS. 5(a) and 5(b) described above are not shown. Though pin conductors 36b on the other side are not shown and description will not be given, these are arranged substantially in symmetry with pin conductors 36a shown in the figures.

Figure 10:
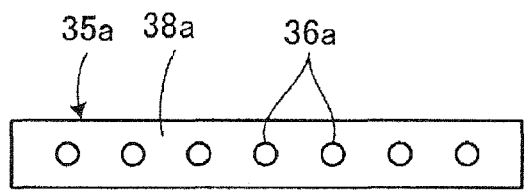
FIG. 10 shows a first example of an arrangement of pin conductors 36*a* shown in FIGS. 4(*a*) and 4(*b*), showing pin conductors 36*a* with an end surface at a tip end 38*a* of inner conductor 35*a* viewed from the side of PLLA sheet 1.

First, referring to FIG. 10, a plurality of pin conductors 36a are arranged in a line, spaced apart from each other by a prescribed distance.

In the example shown in FIG. 10, after the series of process steps (heating, application of high voltage and quenching) for imparting piezoelectricity ends, the PLLA sheet is shifted in the up/down direction or left/right direction by a prescribed distance and, in this state, the series of process steps for imparting piezoelectricity is executed again, and such operations are repeated. Thus, the process for imparting piezoelectricity is done.

Figure 11:
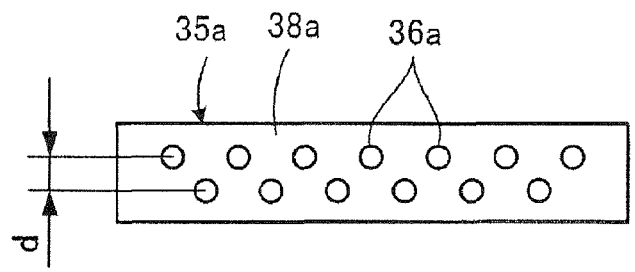
FIG. 11 shows a second example of an arrangement of pin conductors 36*a* shown in FIGS. 4(*a*) and 4(*b*), showing pin conductors 36*a* with an end surface at a tip end 38*a* of inner conductor 35*a* viewed from the side of PLLA sheet 1.

Next, in the example shown in FIG. 11, a plurality of pin conductors 36a are arranged in two lines, spaced apart from each other by a prescribed distance. Pin conductors 36a of each line are positioned to correspond to the space between each of the pin conductors 36a of the other line.

In the example shown in FIG. 11, after the series of process steps for imparting piezoelectricity ends, the PLLA sheet is shifted upward (or downward) by distance d and, in this state, the series of process steps for imparting piezoelectricity is executed again, and such operations are repeated. Thus, the process for imparting piezoelectricity is done over a wide range of PLLA sheet.

Figure 12:
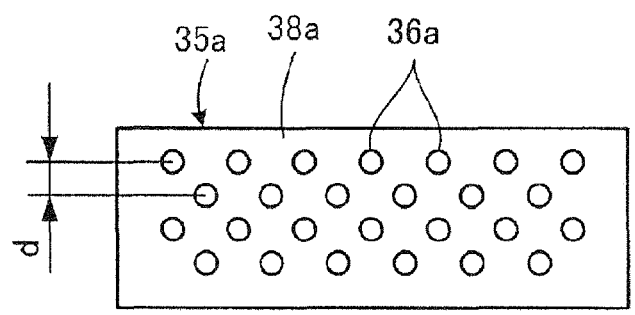
FIG. 12 shows a third example of an arrangement of pin conductors 36*a* shown in FIGS. 4(*a*) and 4(*b*), showing pin conductors 36*a* with an end surface at a tip end 38*a* of inner conductor 35*a* viewed from the side of PLLA sheet 1.

Next, in the example shown in FIG. 12, a plurality of pin conductors 36a are arranged in four lines, spaced apart from each other by a prescribed distance. Pin conductors 36a of each line are positioned to correspond to the space between each of the pin conductors 36a of the next line.

In the example shown in FIG. 12, after the series of process steps for imparting piezoelectricity ends, the PLLA sheet is shifted upward (or downward) by distance d and, in this state, the series of process steps for imparting piezoelectricity is executed again. Thereafter, the PLLA sheet is shifted upward (or downward) by three times the distance d and, in this state, the series of process steps for imparting piezoelectricity is executed again. Then, again, the PLLA sheet is shifted upward (or downward) by the distance d and, in this state, the series of process steps for imparting piezoelectricity is executed. Thereafter, shifting by three times the distance d and shifting by the distance d are executed alternately while the operations as described above are repeated. Thus, the process for imparting piezoelectricity is done over a wide range of PLLA sheet.

The example shown in FIG. 12 is the most advantageous, and the example shown in FIG. 11 is the second most advantageous in that the process for imparting piezoelectricity can be executed collectively over a wider area.

The dimension of inner conductors 35a and 35b and the number of pin conductors 36a and 36b to be arranged in the widthwise and lengthwise directions may be appropriately selected in accordance with design. Further, the cross section of pin conductors 36a and 36b may not necessarily be circular. The cross section may be oval, elliptical, square or polygonal.

Figure 13:
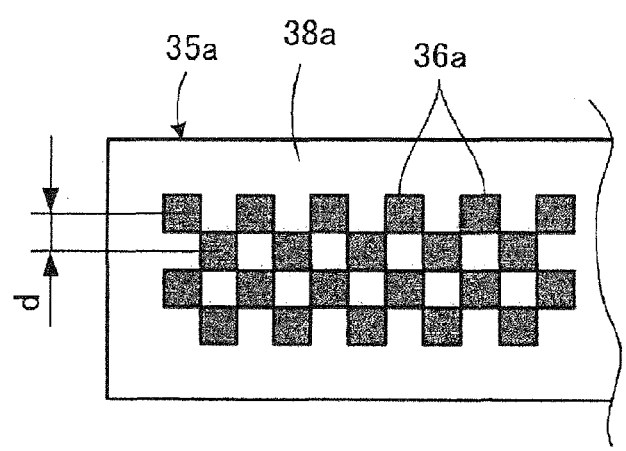
FIG. 13 shows a fourth example of an arrangement of pin conductors 36*a* shown in FIGS. 4(*a*) and 4(*b*), showing pin conductors 36*a* with an end surface at a tip end 38*a* of inner conductor 35*a* viewed from the side of PLLA sheet 1.

FIG. 13 shows an example in which pin conductors 36a each have a square cross-section. The arrangement of pin conductors 36a shown in FIG. 13 is substantially the same as that shown in FIG. 12. It is noted, however, that the distance between adjacent pin conductors 36a is made equal to the length of one side of the square defining the cross section of each pin conductor 36. In FIG. 13, for easier understanding of positions of pin conductors 36a, pin conductors 36a are hatched.

In the example shown in FIG. 13, to execute the process steps for imparting piezoelectricity of PLLA sheet, operations similar to those described with reference to the example of FIG. 12 are executed. Different from the example of FIG. 12, by the example shown in FIG. 13, a PLLA sheet having high piezoelectric constant and smaller unprocessed area can be obtained.

The preferred arrangements of pin conductors 36a and 36b described with reference to FIGS. 10 to 13 may be adopted for the arrangement of pin conductors 58a and 58b shown in FIGS. 7(a), 7(b) and 9.

REFERENCE NUMBERS LIST

1 PLLA sheet
2 helix axes of PLLA molecules
10 manufacturing apparatus
11, 12 signal generators
13 mixer
14 amplifier
16, 18 bias tees
17 PLLA heating unit
20 high voltage DC power supply
30, 50, 50a PLLA processing units
31, 51 housing
35a, 35b inner conductors
36a, 36b, 58a, 58b pin conductors
41 outlet
57a, 57b, 57c, 57d central conductors
60a, 60b base electrodes

The invention claimed is:
1. An apparatus for manufacturing a piezoelectric sheet, the apparatus comprising:
a voltage power supply;
a pair of conductors arranged to hold therebetween a polylactic acid sheet in a thickness direction thereof, said pair of conductors configured to apply a voltage from said voltage power supply in the thickness direction of the polylactic acid sheet;
a microwave generator that generates a microwave; and
a coaxial line arranged to transmit the microwave from said microwave generator; wherein said pair of conductors are connected to an inner conductor of said coaxial line, and adapted to generate heat by dielectric loss when said microwave passes through a capacitor formed by said polylactic acid sheet and said conductors holding the sheet.

2. The apparatus for manufacturing a piezoelectric sheet according to claim 1, wherein the pair of conductors are configured to apply the voltage until helix axes of at least some of polylactic molecules are oriented relative to the thickness direction of said polylactic acid sheet so as to have piezoelectricity in the thickness direction of said polylactic acid sheet.

3. The apparatus for manufacturing a piezoelectric sheet according to claim 1, wherein a plurality of different types of microwaves having frequencies different from each other are generated by said microwave generator.

4. The apparatus for manufacturing a piezoelectric sheet according to claim 3, wherein said plurality of different types of microwaves include at least a first microwave having a frequency effective for heating, a second microwave having a frequency suitable for shaking a main chain of polylactic acid, and a third microwave having a frequency suitable for breaking bonding portions bonding polylactic acid molecules with each other.

5. The apparatus for manufacturing a piezoelectric sheet according to claim 1, further comprising a supply of cooling fluid for quenching said polylactic acid sheet.

6. An apparatus for manufacturing a piezoelectric sheet, comprising:
a voltage power supply;
a pair of conductors arranged to hold therebetween a polylactic acid sheet in a thickness direction thereof, said pair of conductors configured to apply a sufficient voltage from said voltage power supply in the thickness direction of the polylactic acid sheet;
a microwave generator that generates a microwave;
a coaxial line arranged to transmit the microwave from said microwave generator; and
at least one stage of a semi-coaxial cavity filter connected to said coaxial line; wherein
a first conductor of said pair of conductors for applying said voltage is connected to a central conductor of said semi-coaxial cavity filter,
a second conductor of said pair of conductors for applying said voltage is connected to an outer conductor of said semi-coaxial cavity filter, and
said pair of conductors are adapted to generate heat by dielectric loss when said microwave passes through a capacitor formed by said polylactic acid sheet and said pair of conductors.

7. The apparatus for manufacturing a piezoelectric sheet according to claim 6, wherein the pair of conductors are configured to apply the voltage until helix axes of at least some of polylactic molecules are oriented relative to the thickness direction of said polylactic acid sheet so as to have piezoelectricity in the thickness direction of said polylactic acid sheet.

8. The apparatus for manufacturing a piezoelectric sheet according to claim 6, wherein
said first conductor comprises a plurality of pin-shaped conductors; and
said second conductor comprises a planar conductor.

9. The apparatus for manufacturing a piezoelectric sheet according to claim 6, wherein said first and second conductors each comprise a plurality of pin-shaped conductors, and said plurality of pin-shaped conductors form pairs with each other.

10. The apparatus for manufacturing a piezoelectric sheet according to claim 6, wherein a plurality of different types of microwaves having frequencies different from each other are generated by said microwave generator.

11. The apparatus for manufacturing a piezoelectric sheet according to claim 10, wherein said plurality of different types of microwaves include at least a first microwave having a frequency effective for heating, a second microwave having a frequency suitable for shaking a main chain of polylactic acid, and a third microwave having a frequency suitable for breaking a bonding portion bonding polylactic acid molecules with each other.

12. The apparatus for manufacturing a piezoelectric sheet according to claim 6, wherein said pair of conductors each comprise a plurality of pin-shaped conductors arranged to form a plurality of lines, each of said conductors of each line is positioned corresponding to a space formed between each of said conductors of an adjacent line.

13. The apparatus for manufacturing a piezoelectric sheet according to claim 12, wherein said pair of conductors have a square cross section, and the space between said adjacent conductors is equal to a length of a first side of a square defining a cross section of each conductor.

14. The apparatus for manufacturing a piezoelectric sheet according to claim 6, further comprising a supply of cooling fluid for quenching said polylactic acid sheet.

* * * * *